United States Patent
Shiotsuka et al.

(10) Patent No.: US 6,953,599 B2
(45) Date of Patent: Oct. 11, 2005

(54) PROCESS AND APPARATUS FOR PRODUCING A SUBSTRATE HAVING A COATING RESIN LAYER

(75) Inventors: Hidenori Shiotsuka, Kanagawa (JP); Akiharu Takabayashi, Nara (JP); Ichiro Kataoka, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/323,893

(22) Filed: Dec. 20, 2002

(65) Prior Publication Data

US 2003/0134048 A1 Jul. 17, 2003

(30) Foreign Application Priority Data

Dec. 20, 2001 (JP) .......................................... 2001-387633
Dec. 18, 2002 (JP) .......................................... 2002-367223

(51) Int. Cl.⁷ .............................. B05D 5/12; B05D 1/30; B05D 1/02
(52) U.S. Cl. ...................... 427/74; 427/420; 427/385.5; 427/424; 427/427.3; 427/427.4; 427/358
(58) Field of Search ................................ 427/420, 282, 427/74, 385.5, 424, 427.3, 427.4, 240, 358; 118/DIG. 4, 501, 504

(56) References Cited

U.S. PATENT DOCUMENTS 5,368,643 A * 11/1994 Kuster ........................ 118/324
5,389,159 A 2/1995 Kataoka et al. ............. 136/251
6,320,115 B1 11/2001 Kataoka et al. ............. 136/251

FOREIGN PATENT DOCUMENTS

| JP | 4-65556 | 10/1992 |
|---|---|---|
| JP | 6-85299 | 3/1994 |
| JP | 6-151936 | 5/1994 |
| JP | 06-338627 | * 12/1994 |
| JP | 3017231 | 8/1995 |
| JP | 9-36405 | 2/1997 |

* cited by examiner

Primary Examiner—Katherine Bareford
(74) Attorney, Agent, or Firm—Fitzpatrick, Cella, Harper & Scinto

(57) ABSTRACT

A process for producing a substrate having a coating resin layer includes the steps of carrying in a substrate on a fastening table and fastening the substrate to the table and, while moving a spout for spouting a resin layer precursor or the fastening table in a horizontal direction, spouting the resin layer precursor to apply the resin layer precursor onto the substrate to form a resin layer precursor layer on the substrate. Additional steps include carrying out the substrate having the resin layer precursor layer from the fastening table, and drying and curing the resin layer precursor layer on the substrate to form a coating resin layer on the substrate.

11 Claims, 3 Drawing Sheets

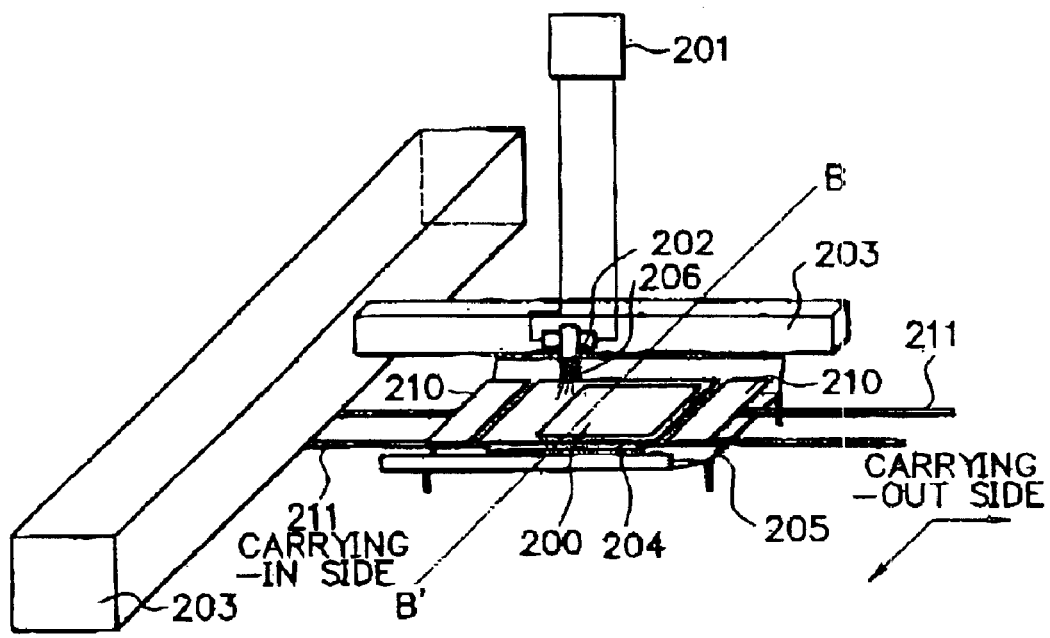
F I G. 2(a)
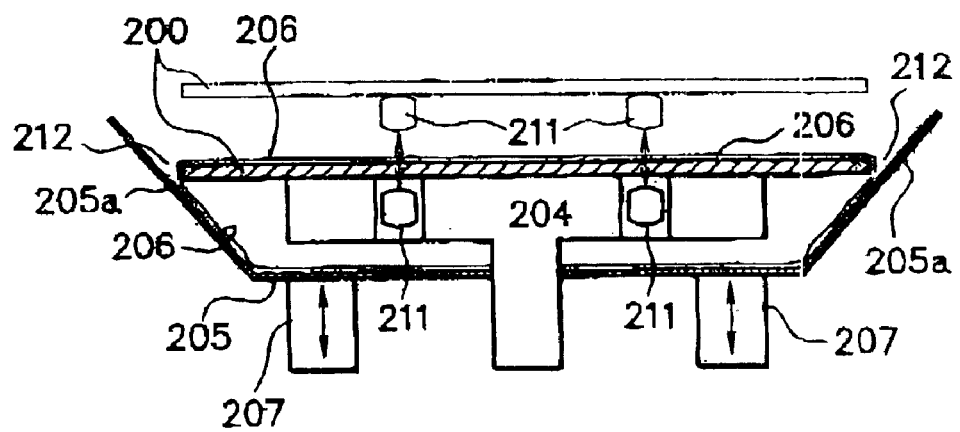
F I G. 2(b)

PROCESS AND APPARATUS FOR PRODUCING A SUBSTRATE HAVING A COATING RESIN LAYER

BACKGROUND OF THE INVENTION

1. Field of the Invention

The present invention relates to a process and an apparatus for producing a substrate having a coating resin layer which excels in weather resistance and durability and which also excels in productivity.

2. Related Background Art

In the case where a substrate such as a plastic plate, a steel plate or a galvanized steel plate is used outdoors, there is often adopted such a manner that prior to using said substrate decorative coating is performed so that the substrate has improved weather resistance and improved durability. In this case, for instance, when the substrate is a steel plate or a galvanized steel plate, it is important that a coating material which is satisfactory in terms of the weather resistance and the durability is used for the decorative coating and the interface between the coat layer and the steel plate or the galvanized steel plate is sufficiently covered and protected. As specific examples of such substrate which is used outdoors, there can be mentioned a sign board in which a metalic plate is used, a roof material in which a metallic plate is used, and a solar cell in which a photovoltaic element which is provided on a metallic substrate is used.

Now, in the case of a solar cell which is installed outdoors, it generally has a structure in that a photovoltaic element is resin-sealed between a surface member and a back face member. FIG. 4 is a schematic cross-sectional view illustrating an example of the structure of such solar cell. A solar cell 400 having such structure as shown in FIG. 4 may be produced, for instance, in a manner in that a surface member 402, a surface side sealing member 403, a photovoltaic element 401, a back face side sealing member 404 and a back face member 405 are laminated in this order from the outermost surface side to obtain a stacked body and the stacked body is subjected to a thermocompression bonding treatment to obtain a solar cell 400.

Japanese Patent Publication No. 4(1992)-65556 and Japanese Registered Utility Model Publication No. 3017231 (issued Oct. 24, 1995) disclose a process for producing such solar call by using a double-vacuum type lamination apparatus. Besides, Japanese Laid-open Patent Publication No 9(1997)-36405 discloses a process for producing such solar cell by using a single-vacuum type lamination apparatus. However, these solar cell production processes using such lamination apparatus have disadvantages such that a plurality of lamination materials are necessary to be used and a large investment in plant and equipment is required, and therefore, the resulting solar cell unavoidably becomes costly, and this results in a raise in the power generation cost of the solar cell.

By the way, in recent years, aiming at reducing the power generation cost of a solar cell there have been made attempts in that a facility where a plurality of solar cells specialized solely with respect to power generation function are installed under controlled environment is used as a small-scale power generation station. The term "controlled environment" means a state in that the solar cells installed are supervised while being enclosed with a fence or a wall and locked so as to prohibit anybody from entering therein except for a specified handling person.

For the solar cells which are installed in such a controlled environment, the safety design adopted for ordinary solar cells for various use purposes in order to endure any accidental occurrence may be partly omitted, and this makes it possible to diminish the power generation cost. To be more specific, for ordinary solar cells which are installed outdoors for the power generation purpose, they are usually designed to have a covering material constitution such that the insulating property can be sufficiently maintained also against surface damages occurred when a person inexperience in the handling, for instance, accidentally scratches their light receiving surfaces. For the solar cells which are installed under the controlled environment, such situation is not necessary to be taken into consideration and therefore, their covering materials can be greatly diminished.

As an example of the solar cell having such covering structure as above described which is installed under the controlled environment, there can be considered a configuration in that a thin film resin layer having a minimum covering constitution which prevents the photovoltaic element of the solar cell from being directly contacted with moisture such as rain is provided in the power generation region of the photovoltaic element.

In order to improve the weather resistance and durability of the photovoltaic element having such configuration, it is important that not only the surface of the photovoltaic element but also the interfaces between exposed portions of the transparent electrode layer, photoelectric conversion layer, back reflecting layer and substrate at the edge portions of the photovoltaic element are resin-sealed.

As a simple method capable of resin-sealing such exposed portions at the edge portions of the photovoltaic element, there can be mentioned a resin-sealing method by way of coating with the use of a resin liquid and a resin powder, specifically, for instance, as described in Japanese Laid-open Patent publication No. 6(1994)-338627 which discloses a resin-sealing method by way of curtain coating and in Japanese Laid-open Patent publication No. 6(1994)-151936 which discloses a resin-sealing method using a slot orifice coater.

These resin-sealing methods are such that a photovoltaic element arranged on a conveyor belt is carried while passing through a resin material spouted in a curtain-like state to form a resin layer on the photovoltaic element. According to this technique, the resin material is uniformly deposited also on a portion of the conveyor belt which surrounds the photovoltaic element and because of this, the edge portions of the photovoltaic element can be resin-sealed.

However, any of the resin-sealing methods has such disadvantages as will be described in the following. That is, upon the resin-sealing treatment, the conveyor belt is stained by the resin material spouted and therefore, when the conveyor belt is continuously used, it is required to perform a cleaning step in order to clean the conveyor belt, independently from the coating step. This makes the apparatus complicated, and an extra investment therefor is necessitated.

Separately, Japanese Laid-open Patent publication No. 6(1994)-85299 discloses a sealing technique to seal a photovoltaic element by way of electrostatic spray painting. The sealing technique disclosed in this document is that using an electrostatic powder coating apparatus of either the corona electrical charging system or the frictional electrification system, charged resin powder is electrostaticaly deposited uniformly on the entire surface of a photovoltaic element carried by a conveyor belt or the like, the resin powder deposited on the photovoltaic element is heated and fused, followed by being cured, whereby sealing the photovoltaic element.

According to this sealing technique, the entire surface of the photovoltaic element including the end portion thereof which is electrically grounded can be resin-sealed. In addition, by charging the conveying means such as the conveyor belt to have a polarity which is the same as that of the resin powder, it is possible to prevent the conveying means from being stained with the resin powder. However, in this case, in order that the photovoltaic element is electrically grounded, a portion of the conveyor belt which is in contact with the photovoltaic element is necessary to be also electrically grounded. Because of this, said portion of the conveyor belt which is in contact with the photovoltaic element is also deposited with the charged resin powder, where the conveyor belt is unavoidably stained with the resin powder. When the resin sealing of the photovoltaic element is continuously performed awhile disregarding the incidence in that the conveyor belt is stained, the yield of a product is disadvantageously decreased.

SUMMARY OF THE INVENTION

The present invention has been accomplished as a result of extensive studies by the present inventors in order to solve the foregoing problems in the prior art.

An object of the present invention is to provide a process which enables to efficiently produce a substrate having a coating resin layer which resin-seals said substrate and which excels in the weather resistance and durability (this process will be hereinafter simply referred to as "substrate production process").

Another object of the present invention is to provide an apparatus which enables to efficiently produce a substrate having a coating resin layer which resin-seals said substrate and which excels in the weather resistance and durability (this apparatus will be hereinafter simply referred to as "substrate production apparatus").

The substrate production process of the present invention includes five embodiments which will be described below.

A first embodiment of the substrate production process of the present invention is a process for producing a substrate having a coating resin layer by using a coating apparatus having a spouting means for spouting a resin layer-forming precursor (hereinafter simply referred to as "resin layer precursor") against at least a substrate to be coated, a fastening table for fastening said substrate thereon, a moving means for moving said spouting means or said fastening table in a horizontal direction, a carrying-in means for carrying-in said substrate on said fastening table, and a carrying-out means for carrying-out said substrate from said fastening table, said process comprising the steps of (a) carrying-in said substrate on said fastening table by said carrying-in means and fastening said substrate at said fastening table; (b) while moving said spouting means or said fastening table in a horizontal direction by said moving means, spouting said resin layer precursor from said spouting means to apply said resin layer precursor onto said substrate to form a resin layer precursor layer on said substrate; (c) carrying-out said substrate having said resin layer precursor layer from said fastening table by said carrying-out means; and (d) drying and curing said resin layer precursor layer on said substrate to form a coating resin layer on said substrate, wherein upon the application of said resin layer precursor onto said substrate in said step (b), a weir member is arranged in the vicinity of edges of said substrate so that said resin layer precursor stays at least in a pair of the edges of the substrate.

A second embodiment of the substrate production process of the present invention is a process for producing a substrate having a coating resin layer by using a coating apparatus having a spouting means for spouting a resin layer precursor against at least a substrate to be coated, a fastening table for fastening said substrate thereon, a moving means for moving said spouting means or said fastening table in a horizontal direction, a carrying-in means for carrying-in said substrate on saint fastening table, a carrying-out means for carrying-out said substrate from said fastening table, and a waste liquid pan for receiving said resin layer precursor spouted from said spouting means outside said substrate, said process comprising the steps of (a) carrying-in said substrate on said fastening table by said carrying-in means and fastening said substrate at said fastening table; (b) while moving said spouting means or said fastening table in a horizontal direction by said moving means, spouting said resin layer precursor from said spouting means to apply said resin layer precursor onto said substrate to form a resin layer precursor layer on said substrate; (c) carrying-out said substrate having said resin layer precursor layer from said fastening table by said carrying-out means; and (d) drying and curing said resin layer precursor layer on said substrate to form a coating resin layer on said substrate, wherein upon the application of said resin layer precursor onto said substrate in said step (b), said waste liquid pan is lifted to make such that said resin layer precursor which is spouted from said spouting means outside said substrate stays between said waste liquid pan and at least a pair of edges of said substrate, where said edges of said substrate are coated with said resin layer precursor.

A third embodiment of the substrate production process of the present invention is a process for producing a-substrate having a coating resin layer by using a coating apparatus having a spouting means for spouting a resin layer precursor against at least a substrate to be coated, a fastening table for fastening said substrate thereon, a moving means for moving said spouting means or said fastening table in a horizontal direction, a carrying-in means for carrying-in said substrate on said fastening table, a carrying-out means for carrying-out said substrate from said fastening table, and a waste liquid pan for receiving said resin layer precursor spouted from said spouting means outside said substrate, said process comprising the steps of (a) carrying-in said substrate on said fastening table by said carrying-in means and fastening said substrate at said fastening table; (b) while moving said spouting mesas or said fastening table in a horizontal direction by said moving means spouting said resin layer precursor from said spouting means to apply said resin layer precursor onto said substrate to form a resin layer precursor layer on said substrate: (e) carrying-out said substrate having said resin layer precursor layer from said fastening table by said carrying-out means; and (d) drying and curing said resin layer precursor layer on said substrate to form a coating resin layer on said substrate, wherein upon the application of said resin layer precursor onto said substrate in said step (b), said fastening table is descended to make such that said resin layer precursor which is spouted from said spouting means outside said substrate stays between said waste liquid pan and at least a pair of edges of said substrate, where said edges of said substrate are coated with said resin layer precursor.

A fourth embodiment of the substrate production process of the present invention is a process for producing a substrate having a coating resin layer, characterized in that a weir member is arranged in the vicinity of edges of a substrate to be coated so that a resin layer precursor stays at said edges of said substrate and said resin layer precursor is spouted against said substrate.

A fifth embodiment of the substrate production process of the present invention is a process for producing a substrate having a coating resin layer by using a coating apparatus having at least a nozzle for spouting a resin layer precursor against a substrate to be coated and a waste liquid pan having an extended gradient verge portion which receives said resin layer precursor spouted from said nozzle, said process including a step of arranging said substrate in a space between said nozzle and said waste liquid pan such that a face to be coated of said substrate is opposed to said nozzle; a stop of moving at least either said substrate or said waste liquid pan so that an interstice with an extent capable of allowing a certain amount of said resin layer precursor spouted from said nozzle to stay therein is formed between said gradient verge portion of said waste liquid pan and edges of said substrate; and a step of spouting said resin layer precursor against said substrate from said nozzle to form a resin layer precursor layer on said substrate.

The substrate production apparatus of the present invention includes three embodiments which will be described below.

A first embodiment of the substrate production apparatus of the present invention is a coating apparatus for forming a resin layer precursor layer on a substrate in order to form a coating resin layer on said substrate, said apparatus comprising a spouting means for spouting a resin layer precursor against at least a substrate to be coated; a fastening table for fastening said substrate thereon; a moving means for moving said spouting means or said fastening table in a horizontal direction; a carrying-in means for carrying-in said substrate on said fastening table: and a carrying-out means for carrying-out said substrate from said fastening table, wherein a step (a) in that said substrate is carried on said fastening table by said carrying-in means and said substrate is fastened at said fastening table, a step (b) in that while moving said spouting means or said fastening table in a horizontal direction by said moving means, said resin layer precursor is spouted from said spouting means to apply said resin layer precursor onto said substrate to form a resin layer precursor layer on said substrate, and a step (c) in that said substrate having said resin layer precursor layer is carried out from said fastening table to the outside by said carrying-out means are sequentially performed, wherein said apparatus includes a weir member which is arranged in the vicinity of edges of said substrate upon the application of said resin layer precursor onto said substrate in said step (b) so that said resin layer precursor stays in at least a pair of the edges of the substrate.

A second embodiment of the substrate production apparatus of the present invention is a coating apparatus for forming a resin layer precursor layer on a substrate in order to form a coating resin layer on said substrate, said apparatus comprising a spouting means for spouting a resin layer precursor against at least a substrate to be coated; a fastening table for fastening said substrate thereon; a moving means for moving said spouting means or said fastening table in a horizontal direction; a carrying-in means for carrying-in said substrate on said fastening table; a carrying-out means for carrying-out said substrate from said fastening table; and a waste liquid pan for receiving said resin layer precursor spouted from said spouting means outside said substrate, wherein a step (a) in that said substrate is carried on said fastening table by said carrying-in means and said substrate is fastened at said fastening table, a step (b) in that while moving said spouting means or said fastening table in a horizontal direction by said moving means, said resin layer precursor is spouted from said spouting means to apply said resin layer precursor onto said substrate to form a resin layer precursor layer on said substrate, and a step (c) in that said substrate having said resin layer precursor layer is carried out from said fastening table to the outside by said carrying-out means are sequentially performed, wherein said waste liquid pan is descended or lifted upon the application of said resin layer precursor onto said substrate in said step (b) to make such that said resin layer precursor which is spouted from said spouting means outside said substrate stays between said waste liquid pan and at least a pair edges of said substrate, where the edges of the substrate are coated with said resin layer precursor.

A third embodiment of the substrate production apparatus of the present invention is a coating apparatus for forming a resin layer precursor layer on a substrate in order to form a coating resin layer on said substrate said apparatus comprising a nozzle for spouting a resin layer precursor against a substrate to be coated; a waste liquid pan having an extended gradient verge portion which receives said resin layer precursor spouted from said nozzle, said waste liquid pan being situated to oppose said nozzle; a fastening table for fastening said substrate thereon to position between said nozzle and said waste liquid pan so that a face to be coated of said substrate is opposed to said nozzle; and an elevator for lifting or descending at least either said waste liquid pan or said fastening table, wherein at least either said waste liquid pan or said fastening table is moved by said elevator so that an interstice with an extent capable of allowing a certain amount of said resin layer precursor spouted from said nozzle to stay therein is formed between said gradient verge portion of said waste liquid pan and the edges of said substrate.

The weir member may have a moving means. The fastening table is preferred to be smaller than the substrate in terms of the size. The conveying system is preferred to be smaller than the substrate in terms of the width. The substrate is preferred to have at least one metal layer or metal oxide layer formed thereon. The resin layer precursor is preferred to have a viscosity in a range of from 10 to 1000 mPa.s. The substrate may be a photovoltaic element. Said photovoltaic element may comprise a metal layer or metal oxide layer, a photoelectric conversion layer, and a transparent electrode layer provided in this order on a substrate. In this case, it is preferred that at least one of interfaces of the substrate, the photoelectric conversion layer and the transparent electrode layer is exposed at an edge of the photovoltaic element.

The present invention has significant advantages which cannot be easily expected from the prior art. Particularly, for instance, in order to resin-seal a substrate having a photovoltaic element as a typical example of the substrate which is used outdoors, by making the fastening table and the conveying system to be smaller than said substrate as above described, when the resin layer precursor is applied on the substrate to coat the substrate, the fastening table and the conveying system are prevented from being stained with the resin layer precursor. Because of this, the maintenance frequency of the apparatus can be diminished, and the operating efficiency of the apparatus is improved.

In addition, because the fastening table and the conveying system are not strained as above described, there is not such an occasion that contaminants are transferred to the photovoltaic element as the substrate from the fastening table or the conveying system to deteriorate the yield. Further, by using a resin layer precursor having a viscosity in a range of from 10 to 1000 mPa.s as the resin layer precursor, the edge portions of the photovoltaic element can be resin-sealed in a desirable state.

Further in addition, by making the waste liquid pan to function in the same manner as the weir member does, the constitution of the apparatus can be simplified and the maintenance of the apparatus can be also simplified. These factors make it possible to efficiently resin-seal the substrate having the photovoltaic element. Thus, according to the present invention, it is possible to continuously produce a photovoltaic element (or a solar cell) having a resin-sealed structure which has an excellent exterior appearance and which excels in the weather resistance and durability.

Other features and advantages of the present invention will be apparent from the following description taken in conjunction with the accompanying drawings.

BRIEF DESCRIPTION OF THE DRAWINGS

FIG. 1(*b*) is a schematic cross-sectional view taken along the line A–A' in FIG. 1(*a*), illustrating the resin-sealed structure of the photovoltaic element shown in FIG. 1(*a*).

FIG. 2(*a*) is a schematic diagram illustrating the constitution of an example of a coating apparatus in the present invention.

FIG. 2(*b*) is a schematic cross-sectional view, taken along the line B–B' in FIG. 2(*a*).

DETAILED DESCRIPTION OF THE PREFERRED EMBODIMENTS

Figure 1A:
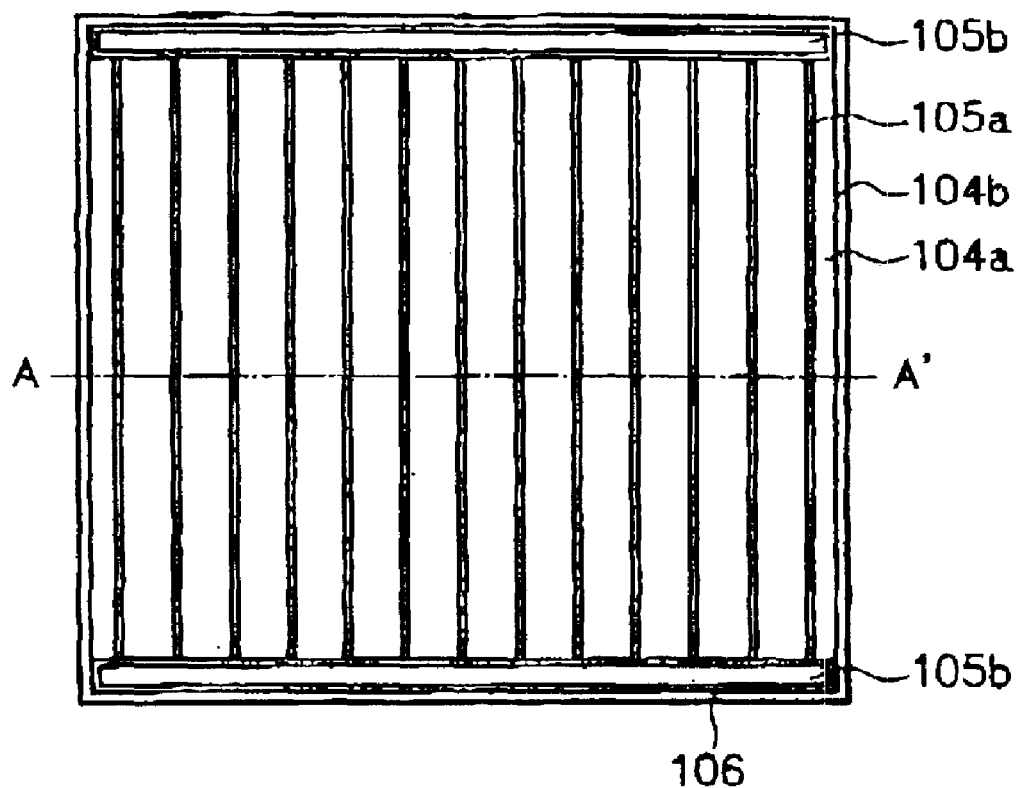
FIG. 1(*a*) is a schematic plan view illustrating a light receiving face of an example of a photovoltaic element as a substrate to be coated in the present invention.

In the following, the preferred embodiments of the present invention will be detailed with reference to the drawings. It should be understood that the present invention is not restricted by these embodiments.

FIGS. 1(*a*) and 1(*b*) are schematic diagrams illustrating an example of a photovoltaic element having a resin-sealed structure as a substrate to be installed outdoors, which is produced in the present invention. Particularly, FIG. 1(*a*) is a schematic plan view illustrating a light receiving face of an example of a photovoltaic element as a substrate to be coated in the present invention, and FIG. 1(*b*) is a schematic cross-sectional view taken along the line A–A' in FIG. 1(*a*), illustrating the resin-sealed structure of the photovoltaic element shown in FIG. 1(*a*).

In FIGS. 1(*a*) and 1(*b*), reference numeral 101 indicates a substrate, reference numeral 102 a back reflecting layer, reference numeral 103 a semiconductor active layer (a photoelectric conversion layer), and reference numeral 104 a transparent electrode layer, reference numeral 105 a collecting electrode (comprising a grid electrode 105*a*), reference numeral 106 an insulating material, and reference numeral 107 a coating resin layer.

In the following, each of the constituents of the resin-sealed photovoltaic element shown in FIGS. 1(*a*) and 1(*b*) will be detailed.

[Substrate 101]

The substrate 101 functions as a substrate to retain the photovoltaic element. The substrate 101 comprises a member capable of functioning as a substrate to retain the photovoltaic element. The substrate 101 is possible to be made such that it can also function as a lower electrode of the photovoltaic element. In this case, the substrate is preferred to comprise a member having an electrically conductive surface. Such member may be an electrically conductive member composed of a metal such as Ta, Mo, W. Al, Cu, or Ti, or an electrically conductive member composed of an alloy of these metals as stainless steel. Besides, the substrate 101 may comprise a carbon sheet or a Pb-plated steel sheet. Alternatively, it is possible to use a film or sheet made of a synthetic resin, a ceramics member or a glass member, respectively having an electrically conductive layer formed on the surface thereof, as the substrate 101.

[Back Reflecting Layer 102]

The back reflecting layer 102 is provided on the substrate 101. The back reflecting layer 102 may comprise a metal layer, a metal oxide layer, or a two-layered structure comprising a metal layer and a metal oxide layer. In the case where the substrate 101 comprises an insulating member such as a synthetic resin film, a ceramics member or a glass member, it is possible that the back reflecting layer 102 provided on the substrate 101 is designed so as to function as the lower electrode of the photovoltaic by adjusting the thickness or the like thereof.

[Semiconductor Active Layer 103]

The semiconductor active layer 103 (the photoelectric conversion layer) is provided on the back reflecting layer 102 and it functions to perform photoelectric conversion. The semiconductor active layer 103 may be composed of a crystalline semiconductor material, an amorphous semiconductor material or a compound semiconductor material. Of these semiconductor materials, art amorphous silicon (a-Si) series semiconductor material is more advantageous in comparison with other semiconductor materials in terms of the production cost. In addition, in the case where the semiconductor active layer 103 is composed of an-amorphous silicon (a-Si) series semiconductor material, the photovoltaic element having said semiconductor active layer has advantages such; that the photovoltaic element has flexibility and it can be readily processed by way of shearing or the like. Further, such photovoltaic element which can be readily processed makes it possible to produce a solar cell module having a desired configuration.

In any case, the semiconductor active layer 103 is necessary to have a stacked structure having a semiconductor junction such as a p-n junction, p-i-n junction or a Schottky junction. Specifically, for instance, the semiconductor active layer 103 may be designed to have a single cell structure having a single semiconductor junction, a tandem cell structure having two p-n or p-i-n junctions, a triple cell structure having three p-n or p-i-n junctions.

As specific examples of such tandem cell structure, there can be mentioned a tandem cell structure in which a top cell having a p-i-n junction structure whose i-type layer comprising an a-Si and a bottom cell having a p-i-n junction structure whose i-type layer comprising an a-Si are stacked; and a tandem cell structure in which a top cell having a p-i-n junction structure whose i-type layer comprising an a-Si and a bottom cell having a p-i-n junction structure whose i-type layer comprising an a-SiGe are stacked.

In any of these tandem structures, it is possible that the top cell is made to comprise a p-i-n junction structure whose i-type layer comprising an a-Si and the bottom cell is made to comprise a p-n junction structure of a thin film polycrystalline semiconductor.

As specific examples of such triple cell structure, there can be mentioned a triple cell structure in which a top cell having a p-i-n junction structure whose i-type layer comprising an a-Si, a middle cell having a p-i-n junction structure whose i-type layer comprising an a-Si, and a bottom cell having a p-i-n junction structure whose i-type layer comprising an a-SiGe are stacked; and a triple cell structure in which a top cell having a p-i-n junction structure whose i-type layer comprising an a-Si, a middle cell having a p-i-n junction structure whose i-type layer comprising an a-SiGe, and a bottom cell having a p-i-n junction structure whose i-type layer comprising an a-SiGe are stacked.

The semiconductor active layer 103 having such structure as above described may be formed by a conventional film-forming technique such as plasma CVD using proper film-forming raw material gas such as silane gas, vacuum deposition, sputtering, or thermal decomposition.

[Transparent Electrode Layer 104]

The transparent electrode layer 104 is provided on the semiconductor active layer 103 (the photoelectric conversion layer) and it functions as the upper electrode of the photovoltaic element. The transparent electrode layer 104 may comprise a layer comprising a metal oxide or a crystalline semiconductor layer obtained by doping a metal oxide layer with an appropriate impurity at a high concentration. The metal oxide can include, for example, $In_2O_3$, $SnO_2$, ITO ($In_2O_3$—$SnO_2$), ZnO, $TiO_2$, and $Cd_2SnO_4$.

The transparent electrode layer 104 may be formed by resistance heating evaporation, sputtering, spraying, or CVD. The above-described impurity-doped crystalline semiconductor layer as the transparent electrode layer 104 may be formed by a conventional impurity-diffusion film-forming method.

Figure 1B:
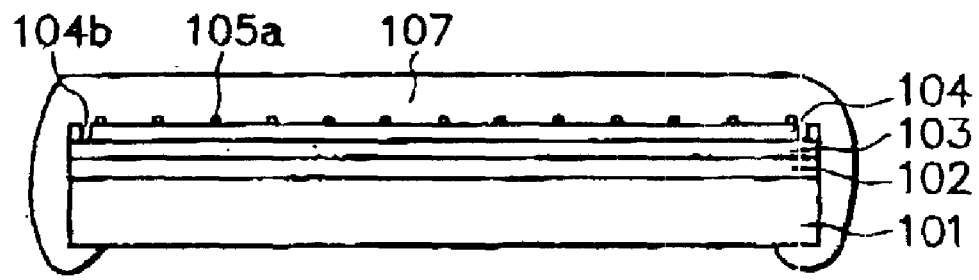

Separately, when a large area photovoltaic element formed on a web substrate by means of a roll-to-roll process is divided to obtain a small area photovoltaic element having a prescribed size, in order to diminish influence of the electrical short circuit at the end portions of the resultant photovoltaic element it is possible make the photovoltaic element to have a power generation region electrically isolated from the substrate (the electrically conductive substrate) by removing a part of the transparent electrode layer of the photovoltaic element to form a portion 104b with no transparent electrode layer [see, FIGS. 1(a) and 1(b)]. The portion 104b with no transparent electrode layer may be formed, for instance, by (i) a method in that an iron chloride-containing etching paste is applied to a portion to be removed to remove said portion by means of screen printing to form a desired pattern (corresponding to the portion 104b) or (ii) a method in that an etching paste is applied to a portion to be removed by means of screen printing, the etching paste applied on the portion to be removed is thermally cured, and washed with water to remove, whereby forming a desired pattern (corresponding to the portion 104b).

[Collecting Electrode 105]

It is possible to provide a grid electrode 105a as the collecting electrode 105 on the transparent electrode layer 104 in order to efficiently collect an electric current. The grid electrode 105a may be formed by means of sputtering, resistance heating, CVD, or photo CVD. Besides, the grid electrode 105a may be formed by a method of screen-printing an electrically conductive paste or a method of fixing a metal wire coated with an electrically conductive paste. In the case where the grid electrode 105a is formed by the method of screen-printing the electrically conductive paste, the electrically conductive paste can include electrically conductive pastes comprising powdery Ag, Au, Cu, Ni, or carbon dispersed in an appropriate binder polymer. The binder polymer can include polyester, epoxy resin, acrylic resin, alkyd resin, polyvinyl acetate, urethane resin, and phenol resin.

Separately, in order that the electricity is readily outputted outside the photovoltaic element, it is preferred to provide a bus-bar electrode 105b [see, FIG. 1(a)]. The bus-bar electrode is constituted by a metallic material having a low electric resistance such as a metal or a metal alloy. Such metal may be a metal selected from the group consisting of Cu, Ag, Au, Pt, Al, and Ni. Such metal alloy may be a metal alloy selected from the group consisting of alloys of these metals.

The bus-bar electrode 105b is preferred to be shaped in a web-like foil form.

[Insulating Material 106]

As the insulating material 106, a double-coated adhesive material comprising a polymer film sandwiched between a pair of adhesive materials is typically used. However, it is possible to use other laminate products comprising a plurality of polymer films and a plurality of adhesive materials which are alternately stacked such that each of the top and bottom members comprises an adhesive material. The polymer film and the adhesive material of the double-coated adhesive material are together used as a part of the insulating material 106 upon arranging the grid electrode 105a or the bus-bar electrode 105b above the semiconductor active layer 103. The polymer film and the adhesive material are preferred to be heat-resistant and have a strength to protect the semiconductor active layer 103 from heat of the solder and burs or arcuation of the bus-bar electrode 105b when a plurality of weather-resistant cells are electrically connected by the bus-bar electrode 105b.

[Resin Layer 107]

As shown in FIG. 1(b), the resin layer 107 is provided so as to seal at least the side end portions and the light receiving face side of the photovoltaic element in order to protect the photovoltaic element not only from moisture but also from other deteriorating environmental factors. It is desired that the resin layer 107 is constituted by a resin material having a total light transmittance of preferably more than 80% or more preferably more than 90% in a light wavelength region of 400 to 1000 nm when an air is made to be a reference, in order to restrain a decrease in the quantity of incident light into the photovoltaic element. In addition, it is desired that the resin layer 107 is constituted by a resin material which maintains the adhesion strength of the resin layer 107 with the photovoltaic element even when the environmental outside temperature is changed and whose internal stress in the resin layer is small. Further, it is desired that the resin layer 107 is constituted by a resin material which has excellent adhesion properties with the transparent electrode layer 104, the semiconductor active layer 103, the back reflecting layer 102 and the substrate 101. Specifically, it is desired for the resin layer 107 to be constituted by a resin material which has excellent initial adhesion properties especially with the substrate 101 and the transparent electrode layer 104 and whose adhesion is slightly changed with time elapse.

As specific examples of such resin material which satisfies the above conditions, there can be mentioned acrylic resins, fluororesins, siloxane polymers, silicon-modified acrylic resins, and polymer blends of these. Of these resin materials, acrylic resins and silicon-modified acrylic resins are particularly preferable. These resin materials is preferred to be crosslinked by incorporating a crosslinking agent therein, in order to improve their heat resistance and weather resistance. The crosslinking agent can include isocyanate compounds having one or more isocyanate groups, blocked isocyanate compounds, melamine resins, and epoxy resins. The foregoing resins layer precursor (that is, the resin layer-forming precursor) may be prepared by dissolving or dispersing any of the above-mentioned resin materials and any of the above-mentioned crosslinking agents in a solvent. In this case, any one-pack type coating material as the resin layer precursor may be prepared by using a blocked isocyanate compound as the crosslinking agent. The use of such one-pack type coating material as the resin layer precursor makes it possible to diminish the cost required in the operation of the coating apparatus.

The viscosity of the resin layer precursor is adjusted to be preferably in a range of from 10 to 1000 mPa.s or more preferably to be about 300 mPa.s. When the viscosity of the resin layer precursor is less than 10 mPa.s, there is a tendency in that merely a thin resin layer with a thickness of less than 1 μm is formed at the cross section of each of the side end portions of the photovoltaic element and because of this, the resin-sealing is insufficient in terms of the long durability. On the other hand, when the viscosity of the resin layer precursor is beyond 1000 mPa.s, there is an occasion such that clogging is occurred in the waste liquid recovery hole or the waste liquid recovery tube to result in a reduction in the productivity.

Now, the resin layer is required to excel especially in the weather resistance because it is provided on the light receiving face side of the photovoltaic element. In order to satisfy this requirement, it is desired for the resin material constituting the resin layer 107 to contain an ultraviolet absorbing agent, a hindered amine series light stabilizer and an antioxidant.

[Formation of Resin Layer 107]

As the method of forming the resin layer 107, it is most appropriate to adopt a method by way of coating in a viewpoint that the resin layer can be readily formed in a desired form at a reasonable cost.

The formation of the resin layer 107 in accordance with the method by way of coating may be performed by using a prescribed coating apparatus. The coating apparatus typically has a spouting means for spouting a resin layer precursor; a fastening table for fastening a substrate having a photovoltaic element to be coated on said fastening table; a moving means for moving said spouting means or said fastening table in a horizontal direction; a carrying-in means for carrying-in said substrate on said fastening table; a carrying-out means for carrying-out said substrate which is coated with said resin layer precursor from said fastening table; and a weir member which is arranged in the vicinity of the edges of said substrate so that said resin layer precursor stays at the edges of said substrate upon forming a layer comprising said resin layer precursor at said substrate. The coating apparatus may have a waste liquid pan which receives said resin layer precursor which is spouted outside said substrate from the spouting means. It is possible to make the waste liquid pan so as to function also au the weir member.

By means of the weir member, the resin layer precursor which is spouted outside the photovoltaic element region of the substrate can be recovered in the vicinity of the edge portions of the photovoltaic element of the substrate. By making the weir member to have a gradient, the recovery of the resin layer precursor can be efficiently performed. By properly adjusting the gradient of the weir member and the clearance between the weir member and the photovoltaic element of the substrate, the residence time of the resin layer precursor can be optionally settled.

By the resin layer precursor stayed in the vicinity of the edge portions of the photovoltaic element of the substrate in this way, the edge portions of the photovoltaic element are coated. The coated state of the edge portions of the photovoltaic element can be adjusted as desired by adjusting the related factors including the viscosity of the resin layer precursor and the residence time of the resin layer precursor.

The weir member is preferred to be constituted by a material which has chemical resistance and is difficult to be oxidized. As specific examples of such material, there can be mentioned resin materials having chemical resistance such as fluororesins and metallic materials which are difficult to be oxidized such as stainless steels.

The installation angle of the weir member to the substrate and the clearance between the weir member and the substrate should be adequately determined by taking the viscosity of a given resin layer precursor used. For instance, in the case where a resin layer precursor (comprising an acrylic resin; the solid content: 30%; the viscosity; 10 mPa.s) is applied on a substrate having a photovoltaic element in an amount to provide a thickness of 40 μm when dried, the installation angle of the weir member is preferred to be small. Specifically, the installation angle of the weir member is preferably in a range of from 5° to 45°, and the clearance is 1 mm at a maximum. When the clearance is beyond 1 mm, the resin layer precursor does not stay between the weir member and the photovoltaic element, and because of this, the object cannot be achieved. It is possible that the weir member is close-contacted with the bottom portion of the photovoltaic element. Separately, in the case where a resin layer precursor (comprising silicon resin; the viscosity: 1000 mPa.s) is applied as well as in the above case, the installation angle of the weir member is in a range of from 30° to 80° and the clearance is about 2 mm at a maximum.

FIG. 2(*a*) is a schematic diagram illustrating the constitution of a specific example of the above-described coating apparatus. FIG. 2(*b*) is a schematic cross-sectional view, taken along the line B–B' in FIG. 2(*a*).

In FIGS. 2(*a*) and 2(*b*), reference numeral 202 indicates the foregoing spouting means. The spouting means 202 may be a spray coater, a curtain coater or a cast coater by means of a T-die. The width of a resin layer precursor 206 spouted from the spouting mean 202 may be optionally determined. Reference numeral 200 indicates the foregoing substrate (the substrate having the photovoltaic element). The moving means 203 is preferred to be able to travel above the photovoltaic element of the substrate 200 at a desired speed while maintaining the interval between the spouting means 202 and the substrate 200 at a constant value. The moving means 203 may be a single-axis robot, a double-axis robot, a multi-axis robot, or an articulated robot. Reference numeral 204 indicates the foregoing fastening table. The fastening table 204 for fastening the substrate 200 (the substrate having the-photovoltaic element) is capable of maintaining the substrate on a level during the time when the resin layer precursor 206 is being applied.

The fastening table 204 is preferred to be smaller than the substrate 200 (the substrate having the photovoltaic element) in terms of the size in order for the fastening table not to be stained with the resin layer precursor 206 spouted from the spouting means 202. The conveying system 211 (comprising the foregoing carrying-in means and the foregoing carrying-out means) serves to carry-in the substrate 200 on the fastening table 204 while retaining the substrate 200 from the bottom side and it also serves to carry-out the substrate 200 from the fastening table 204. As the conveying system 211, a conventional conveyer line or a conventional conveyer rail may be used. In this embodiment, the conveyer rail is used as the conveying system 211. It is desired that the conveying system 211 is arranged so as to situate on an inner side from the width of the photovoltaic element of the substrate 200, in order to prevent the conveying system 211 from being stained with the resin layer precursor 206.

Separately, as shown in FIG. 2(a), by providing a shielding 210 at each of the carrying-in port and the carrying-out port, it is possible to prevent the resin layer precursor 206 from jumping on the photovoltaic element of the substrate 200 to stain the conveying system 211. Fastening the substrate 200 to the fastening table 204 may be performed by a fastening method by way of suction or by means of an electromagnet.

In the embodiment shown in FIGS. 2(a) and 2(b), the conveying system 211 is intermittently operated. To be more specific, the substrate 200 (the substrate having the photovoltaic element) is carried-in from the carrying-in side on the fastening table 204. In this case, the fastening table 204 is preferred to be provided with a slit which allows the conveying system 211 to pass therethrough in a horizontal direction and a vertical direction. The conveying system 211 is once stopped, the conveying system 211 is descended so that the substrate 200 is arranged in the fastening table 204 and the substrate 200 is fastened to the fastening table 204. After the resin layer precursor 206 is applied to coat the photovoltaic element of the substrate 200, the fastening table 104 is descended, where the fastening of the substrate 200 is released and the substrate 200 is returned to the conveying system 211.

Reference numeral 205 indicates the foregoing waste liquid pan. The waste liquid pan 205 serves to recover the resin layer precursor 206 spouted outside the photovoltaic element of the substrate 200. The waste liquid pan 205 is arranged so as to include the moving range of the spouting means 200, particularly, the entire resin layer precursor-spouting region. The resin layer prom-cursor 206 recovered by the waste liquid pan 205 may be discarded, but it is preferred to be reused in a viewpoint of the utilization efficiency.

Separately, the fastening table 104 or the foregoing weir member (including the waste liquid pan 205) has a lifting and descending means 207. Both the fastening table 104 and the weir member may have the lifting and descending means.

In the embodiment shown in FIGS. 2(a) and 2(b), the waste liquid pan 205 is used as the weir member. Upon the application of the resin layer precursor 206, as shown in FIG. 2(b), the waste liquid pan 205 is lifted so that the resin layer precursor 206 Stays between the waste liquid pan 205 and the end face of the substrate 200 (the substrate having the photovoltaic element) [that is a clearance 212 between the extended gradient verge portion 205a of the waste liquid pan 205 and the end face of the substrate 200]. When the edge portions of the substrate 200 are sufficiently impregnated with the resin layer precursor 205, the waste liquid pan 205 is descended and the resin layer precursor 206 accumulated in the waste liquid pan 205 is flown into the drainage hole.

Such operation as above described may be performed by way of lifting and descending the fastening table 104.

The substrate 200 (the substrate having the photovoltaic element) coated with the resin layer precursor 206 in the manner as above described is dried and cured to form a coating resin layer which coats the photovoltaic element of the substrate 200. In the case where the resin layer precursor 206 comprises a solvent series coating material, it is preferred that after the solvent is evaporated, the curing reaction is started. As the measure with respect to the evaporated amount of the solvent prior to the curing reaction, it is preferably more than 75% or more preferably more than 95 in terms of the evaporated percentage of the solvent. The curing condition is properly decided depending on the kind of a curing agent used in the resin layer-forming resin material. For instance, in the case where a blocking type isocyanate compound is used as the crosslinking agent, by using a prescribed blocking agent, the curing temperature can be adjusted. The curing time is preferred to be a period of time in a range of 5 to 60 minutes. To perform the curing for a period of time which exceeds 60 minutes is undesirable because the working efficiency is not good.

The average thickness of the coating resin layer [107, see FIG. 1(b)] formed on the substrate having the photovoltaic element in accordance with the above-described manner is somewhat different depending on the properties of the resin layer-forming resin material used, but in general, it is preferably in a range of 1 to 200 $\mu$m or more preferably in a range of 20 to 150 $\mu$m. When the average thickness is less than 200 $\mu$m, a desired coating resin layer can be readily formed on the substrate having the photovoltaic element in accordance with the above-described manner. Particularly, by adjusting the drying time upon forming the resin layer, without occurrence of foaming upon the curing, a photovoltaic element having a resin-sealed structure which has an excellent exterior appearance and which excels in the weather resistance and durability can be obtained.

As described in the above description, the present invention provides significant advantages which cannot be easily expected from the prior art. Particularly, by making the fastening table and the conveying system to be smaller than said substrate as above described, when the resin layer precursor is applied on the substrate, the fastening table and the conveying system are prevented from being stained with the resin layer precursor. Because of this, the maintenance frequency of the apparatus can be diminished, and the operating efficiency of the apparatus is improved.

In addition, because the fastening table and the conveying system are not stained as above described, there is not such an occasion that contaminants are transferred to the photovoltaic element as the substrate from the fastening table or the conveying system to deteriorate the yield. Further, by making the waste liquid pan to function in the same manner as the weir member does as above described, the constitution of the apparatus can be simplified and the maintenance of the apparatus can be also simplified. Further in addition, because of using the resin layer precursor having a viscosity in a range of from 10 to 1000 mPa.s as above described, the edge portions of the photovoltaic element as the substrate can resin-sealed in a desirable state.

These factors make it possible to efficiently resin-seal a substrate having a photovoltaic element. Thus, according to the present invention, it is possible to continuously produce a photovoltaic element (or a solar cell) having a resin-sealed structure which has an excellent exterior appearance and which excels in the weather resistance and durability.

In the following, the features and advantages of the present invention will be described in more detail with reference to examples. It should be understood that these examples are only for illustrative purposes and are not intended to restrict the technical scope of the invention.

EXAMPLE 1

1. Preparation of Photovoltaic Element:

An amorphous silicon (a-Si) photovoltaic element having such configuration as shown in FIGS. 1(a) and 1(b) with no resin layer 107 was prepared in the following manner.

There was provided a well-cleaned stainless web substrate having a thickness of 150 μm and a width of 355 mm as the substrate 101. On the web substrate, there was formed a two-layered back reflecting layer 102 comprising a 5000 Å thick Al film/a 5000 Å thick ZnO film by means of the conventional roll-to-roll sputtering process.

On the back reflecting layer 102 thus formed, there was formed a tandem type photoelectric conversion semiconductor layer as the semiconductor active layer 103 comprising a 150 Å thick n-type amorphous silicon layer/a 4000 Å thick i-type amorphous silicon layer/a 100 Å thick p-type microcrystalline silicon layer/a 100 Å thick n-type amorphous silicon layer/a 800 Å thick i-type amorphous silicon layer/a 100 Å thick p-type microcrystalline silicon layer stacked in the named order from the substrate side by means of the conventional roll-to-roll plasma CVD process, wherein each n-type amorphous silicon layer was formed by using $SiH_4$ gas, $PH_3$ gas and $H_2$ gas; each i-type amorphous silicon layer was formed by using $SiH_4$ gas and $H_2$ gas; and each p-type microcrystalline silicon layer was formed by using $SiH_4$ gas, $BF_3$ gas and $H_2$ gas.

Then, on the semiconductor active layer 103, as the transparent electrode layer 104, there was formed a 700 Å thick $In_2O_3$ film by means of the conventional heat resistance heating evaporation process wherein an in source was evaporated in an $O_2$ gas atmosphere.

Thus, there was obtained an element comprising the back reflecting layer 102, the semiconductor active layer 103 and the transparent electrode layer 104 stacked in this order on the web substrate 101.

Using a shearing machine having a pair of upper die steel blades and a pair of lower die steel blades (the blade interval: 50 μm), the web substrate 101 having the element formed thereon was divided in a vertical direction to the flow direction of the web substrate to obtain a plurality of elements having a size of 355 mm (width)×240 mm (length). Here, each of the resultant elements has a convex form with a height of 48 μm at one of the opposite cut end faces thereof.

For each element, at a prescribed portion of the transparent electrode layer 104 which is to be removed to form a portion 104b with no transparent electrode layer so that the convex form is situated outside the effective power generation region, an etching paste whose mains component comprising iron (III) chloride was applied by a conventional screen-printing apparatus, whereby said prescribed portion was removed to form said portion 104b with no transparent electrode layer.

Each of the elements thus treated was subjected to a defect-removing treatment in the following manner. Each element was immersed in an aluminum chloride aqueous solution having a conductivity of 50 to 70 mS and an electrode plate as a counter electrode was immersed in said aqueous solution so as to oppose to the transparent electrode layer of the element, where the element was electrically grounded, and a positive electric potential of 3–5 V was impressed to the electrode plate for 2 seconds, whereby portions of the transparent electrode layer corresponding to the shunted portions of the element were selectively decomposed.

For each of the elements having subjected to the defect-removing treatment in this way, on the transparent electrode layer 104 thereof, a grid electrode 105a and a bus-bar electrode 105b as the collecting electrode 105 were provided, and an insulating material 106 comprising an adhesive body was arranged at the portion 104b with no transparent electrode layer and the outside portion thereof. To be more specific, a double-coated adhesive body as the insulating material 106 was arranged at the portion 104b and the outside portion thereof which are situated on each of the opposite side end portions of the transparent electrode layer 104 of the element. And as the grid electrode 105a, a plurality of copper wires covered by an electrically conductive coat and having a diameter of 100 μm were spacedly arranged on the transparent electrode layer 104 at an equal interval of 6 mm and their opposite ends were provisionally fixed on the insulating materials 106 arranged on the opposite side end portions of the transparent electrode layer 104, a bus-bar electrode 105b was arranged on each of the insulating materials 106 so as to join with the end portions of the grid electrodes 105a, followed by subjecting to a thermocompression bonding treatment to form a collecting electrode.

Thus, there were obtained a plurality of photovoltaic elements.

2. Formation of Resin Layer 107:

For each of the photovoltaic elements obtained in the above 1, a coating resin layer 107 was formed by using the coating apparatus shown in FIGS. 2(a) and 2(b), as will be described below.

(1). Preparation of Resin Layer Precursor:

Hexamethylene diisocyanate blocked with methyl ethyl ketoxime was added to an acrylic resin so that NCO/OH became to be 1.5, and the resultant was diluted with xylene, methyl isobutyl ketone and ethyl acetate so that the solid content became to be 45 wt. % to obtain a resin layer precursor having a viscosity of 126 mPa.s.

Figure 3:
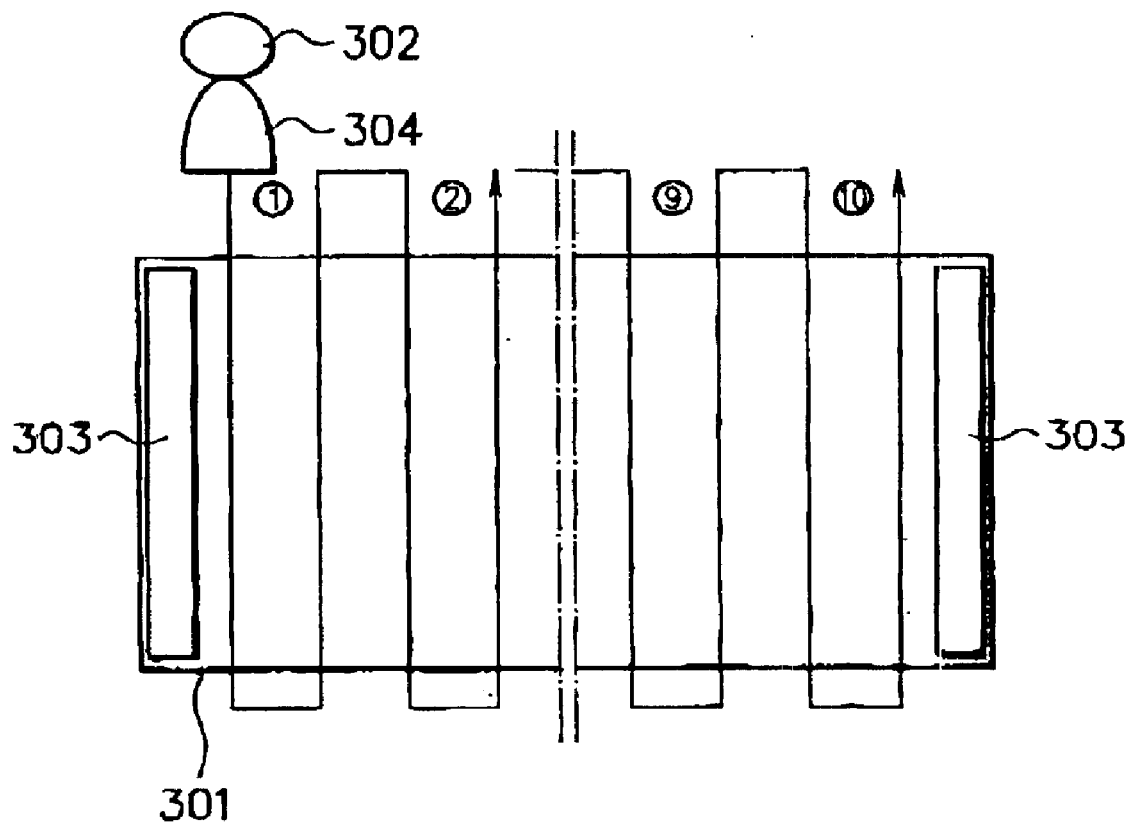
FIG. 3 is a schematic diagram illustrating a coating work in Example 1 which will be described later.
Figure 4:
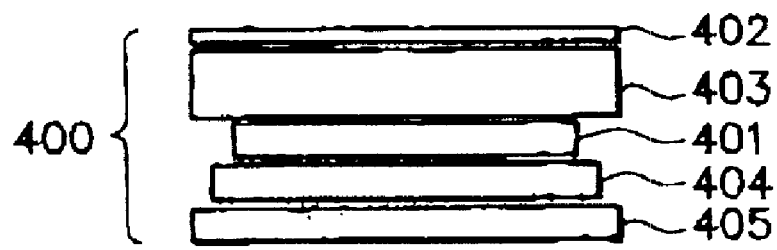
FIG. 4 is a schematic cross-sectional view illustrating the structure of an example of an ordinary solar cell (or an ordinary photovoltaic element).

(2). Coating Apparatus:

As the spouting means of the coating apparatus, an airless spray apparatus 201 having a spouting nozzle 202. By adjusting the setting of the airless spray apparatus 201, the position of the spouting nozzle 202 is adjusted so that the resin layer precursor 206 spouted from the spouting nozzle 202 gets down on the surface of the photovoltaic element to be coated in a state in that the spouting width of the resin layer precursor 206 is 15±1 mm. The airless spray apparatus 201 as the spouting means is fixed to a double-axis robot as the moving means 203. The double-axis robot 203 is instructed so as to make such that the operation of the spouting nozzle 202 to spout the resin layer precursor 206 to the photovoltaic element goes back and forth above the photovoltaic element 10 times as shown in FIG. 3 so as to enable to coat a desired area of the photovoltaic element. In FIG. 3, reference numeral 301 indicates the photovoltaic element, reference numeral 302 the spouting nozzle, reference numeral 303 the bus-bar electrode, and reference numeral 304 the resin layer precursor.

(3). Formation of Resin Layer 107:

The formation of the coating resin layer 107 on the photovoltaic element (200) by using the above-described coating apparatus was performed in the following manner.

(i). The photovoltaic element is fastened onto the fastening table 204 such that the photovoltaic element is horizontal on the fastening table 204.

(ii). The waste liquid pan 205 is lifted to a position where the clearance between the waste liquid pan and the edge portions of the photovoltaic element becomes to be 0.5 mm.

(iii). While spouting the resin layer precursor 206 from the spouting nozzle 202, the spouting nozzle is made to move above the photovoltaic element 200 as shown in FIG. 3.

(iv). After the application of the resin layer precursor 206 on the photovoltaic element 200 is completed, the waste liquid pan 205 is descended and the fastening of the photovoltaic element 200 to the fastening table 204 is released, and the photovoltaic element 200 coated with the resin layer precursor 206 is taken out from the coating apparatus.

(v). The photovoltaic element 200 coated with the resin layer precursor 206 is dried in an oven whose inside is maintained at 60° C. for 10 minutes.

Thereafter, the photovoltaic element is maintained in an oven whose inside is maintained at 100° C. for 10 minutes, then the inside temperature of the oven is increased to 180° C. for 10 minutes, where the photovoltaic element was heated at 180° C. for 5 minutes to cure the coated layer of the photovoltaic element.

By the above operation, a coating resin layer having an average thickness of 40 μm is formed on the photovoltaic element in such a state as shown in FIG. 1(b).

In this way, there were prepared three photovoltaic elements having a resin-sealed structure as shown in FIG. 1(b).

3. Evaluation:

Each of the three photovoltaic elements obtained in the above was evaluated as will be described below.

(1). End Face Observation:

The cross section of the end face of the photovoltaic element was optically observed.

The observed results are shown in Table 1 an the basis of the following criteria.

A: a case where the end faces of any of the three photovoltaic elements are entirely resin-sealed in a desirable state, B: a case where at least one of the three photovoltaic element is such that non resin-sealed portion is present at part of the edge portions.

(2). Electrolytic Corrosion Test:

The photovoltaic element and a counter electrode were arranged so as to have an interval of 5 mm between them. An electrolytic solution was dropped so as to spread over the photovoltaic element and the counter electrode, and by making the substrate of the photovoltaic element to be a positive electrode and making the counter electrode to be a negative electrode, a voltage of 2.0 V was applied between the two electrodes for 3 hours, where the internal state of the photovoltaic element was optically observed.

The observed results are shown in Table 1 on the basis of the following criteria.

A: a case where substantially no change is observed in the internal state of any of the three photovoltaic elements.

B: a case where internal layer-peeling is observed with respect to at least one of the three photovoltaic elements.

EXAMPLE 2

The procedures of Example 1 were repeated, except that a curtain coater was used as the spouting means and the spouting width of the resin layer precursor to get down on the surf ace of the photovoltaic element was made to be 300 mm, to obtain three photovoltaic elements having a resin-sealed structure.

The resultant three photovoltaic elements were evaluated in the same manner as in Example 1. The evaluated results are shown in Table 1.

COMPARATIVE EXAMPLE 1

The procedures of Example 1 were repeated, except that the resin layer precursor was applied to the photovoltaic element in a state that the waste liquid pan was maintained at a position having a distance of 20 mm from the edge portions of the photovoltaic element without lifting the waste liquid pan, to obtain three photovoltaic elements having a resin-sealed structure.

The resultant three photovoltaic elements were evaluated in the same manner as in Example 1. The evaluated results are shown in Table 1.

COMPARATIVE EXAMPLE 2

The procedures of Example 2 were repeated, except that the resin layer precursor was applied to the photovoltaic element in a state that the waste liquid pan was maintained at a position having a distance of 20 mm from the edge portions of the photovoltaic element without lifting the waste liquid pan, to obtain three photovoltaic elements having a resin-sealed structure.

The resultant three photovoltaic elements were evaluated in the same manner as in Example 1. The evaluated results are shown in Table 1.

As will be apparent from the results shown in Table 1, it is understood that in Examples 1 and 2, the edge portions of any of the photovoltaic elements were resin-sealed in a desirable state and because of this, good results are afforded also in the electrolytic corrosion test. Separately, in each of Examples 1 and2, the conveying systems were substantially not stained with the resin layer precursor during the process of forming the layer of the resin layer precursor. On the other hand, in each of Comparative Examples 1 and 2, the edge portions of each of the photovoltaic elements were not sufficiently resin-coated and because of this, in the electrolytic corrosion test, there was observed the dissolution of the zinc oxide from the back reflecting layer at the non resin-coated portion.

TABLE 1

|  | end face sealed state | electrolytic corrosion test |
|---|---|---|
| Example 1 | A | A |
| Example 2 | A | A |
| Comparative Example 1 | B | B |
| Comparative Example 2 | B | B |

What is claimed is:

1. A process for producing a substrate having a coating resin layer by using a coating apparatus having a spouting means for spouting a resin layer precursor against at least a substrate to be coated, a fastening table for fastening said substrate thereon, a moving means for moving said spouting means or said fastening table in a horizontal direction, a carrying-in means for carrying-in said substrate on said fastening table, a carrying-out means for carrying-out said substrate from said fastening table, and a waste liquid pan for receiving said resin layer precursor spouted from said spouting means outside said substrate, said process comprising the steps of (a) carrying-in said substrate on said fastening table by said carrying-in means and fastening said substrate at said fastening table; (b) while moving said spouting means or said fastening table in a horizontal direction by said moving means, spouting said resin layer precursor from said spouting means to apply said resin layer precursor onto said substrate to form a resin layer precursor layer on said substrate; (c) carrying-out said substrate having said resin layer precursor layer from said fastening table by said carrying-out means; and (d) drying and curing said resin layer precursor layer on said substrate to form a coating resin layer on said substrate, wherein upon the application of said resin layer precursor onto said substrate in said step (b), said waste liquid pan is lifted to make such that said resin layer precursor which is spouted from said spouting means outside said substrate stays between said waste liquid pan and at least a pair of edges of said substrate, where said edges of said substrate are coated with said resin layer precursor.

2. A process for producing a substrate having a coating resin layer by using a coating apparatus having a spouting means for spouting a resin layer precursor against at least a substrate to be coated, a fastening table for fastening said substrate thereon, a moving means for moving said spouting means or said fastening table in a horizontal direction, a carrying-in means for carrying-in said substrate on said fastening table, a carrying-out means for carrying-out said substrate from said fastening table, and a waste liquid pan for receiving said resin layer precursor spouted from said spouting means outside said substrate, said process comprising the steps of (a) carrying-in said substrate on said fastening table by said carrying-in means and fastening said substrate at said fastening table; (b) while moving said spouting means or said fastening table in a horizontal direction by said moving means, spouting said resin layer precursor from said spouting means to apply said resin layer precursor onto said substrate to form a resin layer precursor layer on said substrate; (c) carrying-out said substrate having said resin layer precursor layer from said fastening table by said carrying-out means; and (d) drying and curing said resin layer precursor layer on said substrate to form a coating resin layer on said substrate, wherein upon the application of said resin layer precursor onto said substrate in said step (b), said fastening table is descended to make such that said resin layer precursor which is spouted from said spouting means outside said substrate stays between said waste liquid pan and at least a pair of edges of said substrate, where said edges of said substrate are coated with said resin layer precursor.

3. The process according to claim 1 or 2, wherein said fastening table is of a size which is smaller than that of said substrate.

4. The process according to claim 1 or 2, wherein each of said moving means, said carrying-in means and said carrying-out means is of a size which is smaller than the width of said substrate.

5. The process according to claim 1 or 2, wherein said substrate has a least either a metal layer or a metal oxide layer thereon.

6. The process according to claim 1 or 2, wherein said resin layer precursor has a viscosity in a range of from 10 to 1000 mPa.s.

7. The process according to claim 1 or 2, wherein said substrate is a photovoltaic element.

8. The process according to claim 7, wherein said photovoltaic element comprises a photoelectric conversion layer and a transparent electrode layer provided in this order on a substrate.

9. The process according to claim 8, wherein at least one of interfaces of said substrate, said photoelectric conversion layer and said transparent electrode layer is exposed at an edge of said photovoltaic element.

10. A process for producing a substrate having a coating resin layer by using a coating apparatus having at least a nozzle for spouting a resin layer precursor against a substrate to be coated and a waste liquid pan having an extended gradient verge portion which receives said resin layer precursor spouted from said nozzle, said process including a step of arranging said substrate in a space between said nozzle and said waste liquid pan such that a face to be coated of said substrate is opposed to said nozzle; a step of moving at least either said substrate or said waste liquid pan so that an interstice with an extent capable of allowing a certain amount of said resin layer precursor spouted from said nozzle to stay therein is formed between said gradient verge portion of said waste liquid pan and edges of said substrate; and a step of spouting said resin layer precursor against said substrate from said nozzle to form a resin layer precursor layer on said substrate.

11. The process according to claim 10, wherein after said resin layer precursor is spouted, said waste liquid pan is parted from said substrate.

* * * * *

UNITED STATES PATENT AND TRADEMARK OFFICE
CERTIFICATE OF CORRECTION

PATENT NO. : 6,953,599 B2
APPLICATION NO. : 10/323893
DATED : October 11, 2005
INVENTOR(S) : Hidenori Shiotsuka et al.

It is certified that error appears in the above-identified patent and that said Letters Patent is hereby corrected as shown below:

COLUMN 4:

Line 33, "a-substrate" should read --a substrate--.

COLUMN 8:

Line 43, "such;" should read --such--.

COLUMN 10:

Line 48, "i:s" should read --is--.

COLUMN 11:

Line 60, "an" should read --as--.

COLUMN 13:

Line 54, "Stays" should read --stays--.

COLUMN 15:

Line 29, "in$_2$O$_3$" should read --ln$_2$O$_3$--.
Line 30, "in" should read --In--.
Line 49, "mains" should read --main--.

COLUMN 17:

Line 31, "state," should read --state.--.
Line 57, "surf ace" should read --surface--.

UNITED STATES PATENT AND TRADEMARK OFFICE
CERTIFICATE OF CORRECTION

PATENT NO. : 6,953,599 B2
APPLICATION NO. : 10/323893
DATED : October 11, 2005
INVENTOR(S) : Hidenori Shiotsuka et al.

It is certified that error appears in the above-identified patent and that said Letters Patent is hereby corrected as shown below:

COLUMN 18:

Line 26, "and2," should read --and 2,--.

COLUMN 20:

Line 8, "a" (first occurrence) should read --at--.

Signed and Sealed this

Eighth Day of August, 2006

JON W. DUDAS
*Director of the United States Patent and Trademark Office*